United States Patent [19]
Nordeng

[11] Patent Number: 5,485,115
[45] Date of Patent: Jan. 16, 1996

[54] IMPEDANCE SYNTHESIZER

[75] Inventor: Arnold E. Nordeng, Mukilteo, Wash.

[73] Assignee: Fluke Corporation, Everett, Wash.

[21] Appl. No.: 160,992

[22] Filed: Dec. 2, 1993

[51] Int. Cl.$^6$ ................................................. H03H 11/48
[52] U.S. Cl. ............................................. 327/363; 333/214
[58] Field of Search ....................................... 307/490, 491,
307/492, 493, 494, 529, 262, 264; 333/213,
214; 327/363, 362, 306, 105, 335, 336

[56] References Cited

U.S. PATENT DOCUMENTS

| | | | |
|---|---|---|---|
| 3,993,968 | 11/1976 | Lee | 333/214 |
| 4,333,157 | 6/1982 | Lee | 333/214 |
| 4,354,169 | 10/1982 | Nossek | 333/214 |
| 4,383,230 | 5/1983 | Manzolini | 333/214 |
| 4,395,643 | 7/1983 | Lehmann | 307/264 |
| 4,516,041 | 5/1985 | Quan | 307/262 |
| 4,644,306 | 2/1987 | Kleinberg | 333/214 |
| 4,779,056 | 10/1988 | Moore et al. | 330/107 |
| 4,885,528 | 12/1989 | Tanaka et al. | 324/713 |
| 4,963,845 | 10/1990 | Collier | 333/214 |
| 5,166,560 | 11/1992 | Liu | 307/491 |
| 5,231,315 | 7/1993 | Thelen, Jr. | 307/491 |

*Primary Examiner*—John S. Heyman
*Assistant Examiner*—My-Trang Nu Ton
*Attorney, Agent, or Firm*—George T. Noe

[57] ABSTRACT

An impedance synthesizer includes an amplifier with selectable gain and a reference capacitor, resistor, or inductor for providing a plurality of synthesized impedance values. The voltage gain of the amplifier is controlled by a programmable multiplying digital-to-analog converter which allows the selection of a myriad of desired synthesized impedances with high precision and accuracy.

10 Claims, 1 Drawing Sheet

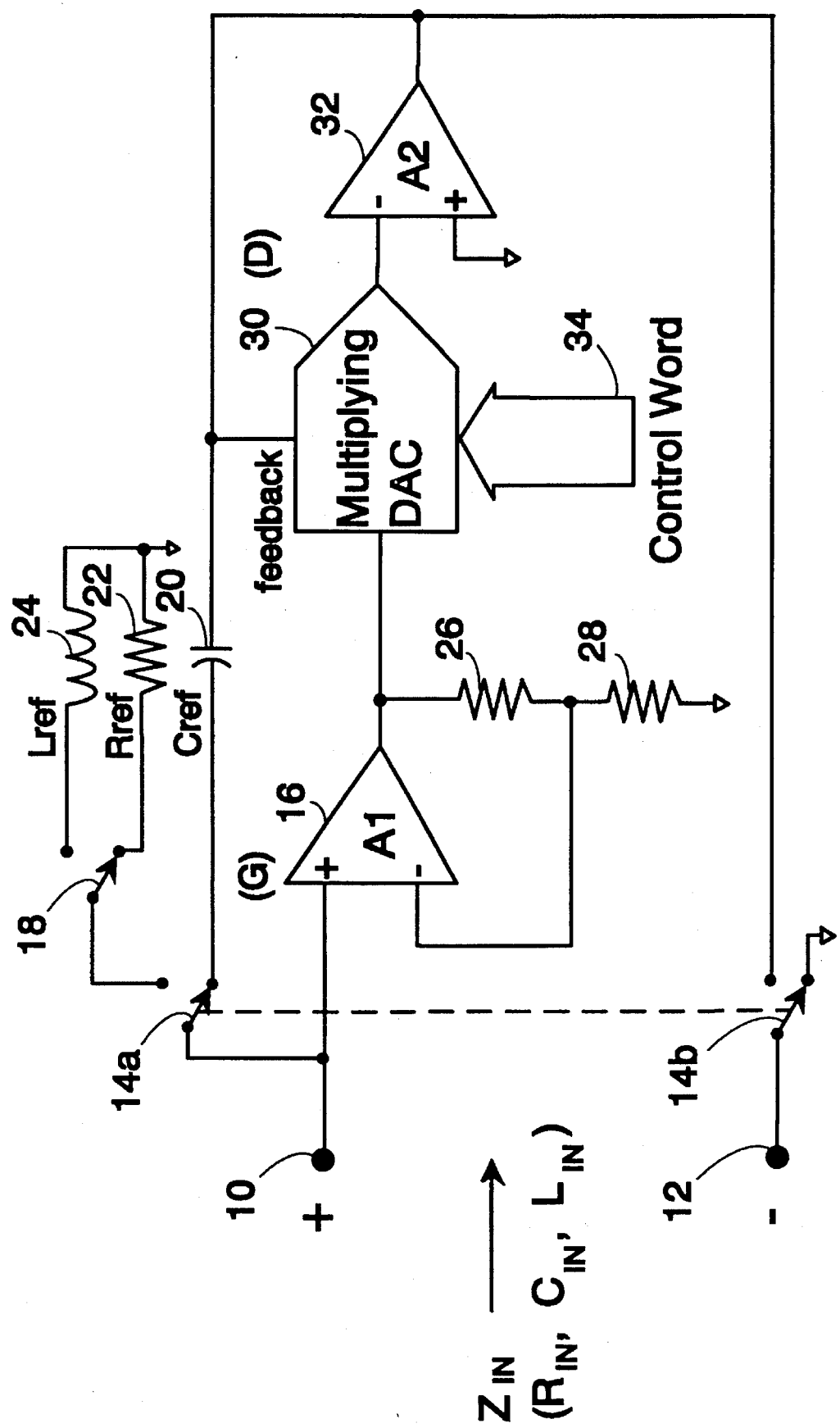
FIGURE

IMPEDANCE SYNTHESIZER

BACKGROUND OF THE INVENTION

This invention relates generally to the simulation of impedance using active circuits and in particular to an impedance synthesizer capable of synthesizing a wide range of precise resistance, capacitance, and inductance values.

Calibrating electronic test and measurement equipment is commonly done by measuring a wide range of known impedance values with the equipment to be calibrated and adjusting the circuits in such equipment to precisely match the measured values. The known impedance values are provided by a variety of discrete reference components with known resistance, capacitance, and inductance values that are used as reference standards. Impedance is related to resistance, inductance, and capacitance as a function of frequency in the well known and accepted manner. During a calibration sequence, each reference component is individually measured by the instrument under calibration and the measured value is compared with the known value. Different instruments require different reference components. The result is a calibration method that is cumbersome because each discrete component must be handled separately, relatively inflexible because the number of component values on hand is limited and may not meet the needs of different calibration tasks, and expensive since reference components must be separately characterized and maintained.

SUMMARY OF THE INVENTION

In accordance with the present invention, an impedance synthesizer provides a plurality of synthesized impedance values, thereby eliminating the need to utilize a myriad of separate or discrete components. An operational amplifier voltage gain is set precisely with a multiplying digital-to-analog converter (DAC). The multiplying DAC is digitally programmable via a parallel data bus which can be connected to a microprocessor or digital controller. The amplifier is configurable either for shunt mode or series mode depending on the type of impedance to be synthesized. A single reference capacitor, resistor, or inductor, selected by means of switches which also select the amplifier configuration, serves as the basis for synthesizing multiple component values based on the programmed gain setting of the operational amplifier.

One feature of the invention is to provide synthesized impedance values across a pair of reference terminals.

Another feature of the invention is the ability to synthesize multiple values of resistances, capacitances, and inductances over a wide range of values based on a single reference resistor, capacitor, or inductor and a small number of additional components.

Another feature of the invention is the ability to program new resistance, capacitance, and inductance values simply by storing a new digital control word corresponding to a desired component value in a multiplying DAC.

Another feature of the invention is the ability to program resistance, capacitance, and inductance values with high precision and accuracy, taking advantage of the precision of a multiplying DAC and the accuracy of a reference component.

Other features, attainments, and advantages will become apparent to those skilled in the art upon a reading of the following description when taken in conjunction with the accompanying drawing.

BRIEF DESCRIPTION OF THE DRAWINGS

The single FIGURE is a schematic diagram of an impedance synthesizer in accordance with the present invention.

DETAILED DESCRIPTION OF THE INVENTION

Referring to the FIGURE, there is shown the basic elements of a proposed commercial embodiment of the present invention. A synthesized impedance is formed across reference terminals 10 and 12 and provided to a device to be calibrated. A ganged single pole double throw switch 14 selects a capacitance-synthesizing mode in its lower position as shown and a resistance- or inductance-synthesizing mode in its upper position. Switch 14a selects reference terminal 10 and the high impedance non inverting input of the operational amplifier 16 between a reference capacitor 20 in capacitance-synthesizing mode and a switch 18 which further selects either a resistance- or inductance-synthesizing mode. Switch 18 selects between a reference resistor 22 and a reference inductor 24 which are both connected at one end to ground. Operational amplifier 16 is applied in a conventional non inverting amplifier configuration with gain G set by the series combination of a pair of resistors 26 and 28 which form a voltage divider of the output voltage which in turn is fed back to an inverting input of operational amplifier 16. An output from operational amplifier 16 is coupled to a multiplying digital-to-analog converter (DAC) 30 which in turn forms the gain setting element of an operational amplifier 32. The combination of multiplying DAC 30 and operational amplifier 32 form an inverting amplifier with a precisely set gain of D. The output of operational amplifier 32 is coupled to reference capacitor 20 and to the feedback connection of multiplying DAC 30 which contains a resistance network which acts as a precision programmable voltage divider connected to the inverting input of operational amplifier 32 in a conventional inverting amplifier configuration. A digital control word received on parallel data bus 34, which can be provided by a microprocessor or digital controller, is used to program the multiplying DAC 30. Switch 14b selects reference terminal 12 between ground in the capacitance-synthesizing mode and the output of operational amplifier 32 in the resistance- or inductance-synthesizing mode.

In the capacitance-synthesizing mode, the circuit resembles an amplifier formed from the series combination of operational amplifier 16, multiplying DAC 30, and operational amplifier 32 with an overall gain of $G*D$ with reference capacitor 20 (Cref) connected between the input and the output of the amplifier. With the amplifier configured for series mode, the effective capacitance between reference terminals 10 and 12 is Cin where $Cin=Cref*(1+G*D)$.

In the inductance-synthesizing mode, the circuit again resembles an amplifier with an overall gain of $G*D$ but with reference inductor 24 (Lref) connected between the input of the amplifier and ground and output of the amplifier is coupled to reference terminal 12. With the amplifier configured for shunt mode, the effective inductance between reference terminals 10 and 12 is Lin where $Lin=Lref*(1+G*D)$.

In the resistance-synthesizing mode, the circuit again resembles an amplifier with an overall gain of $G*D$ but with reference resistor 22 (Rref) connected between the input of the amplifier and ground. With the amplifier configured for shunt mode, the effective resistance between reference terminals 10 and 12 is Rin where $Rin=Rref*(1+G*D)$.

It will be obvious to those having ordinary skill in the art that many changes may be made in the details of the above described preferred embodiments of the invention without departing from the spirit of the invention in its broader aspects. For example, a precision resistor network could be implemented in place of the multiplying DAC to select the amplifier gain with attendant reduction in versatility. Furthermore, a different type of multiplying DAC can be substituted that combines multiplying DAC 30 and operational amplifier 32 as a single component. Therefore, the scope of the present invention should be determined by the following claims.

What I claim as my invention is:

1. An impedance synthesizer, comprising:
   reference means for providing a predetermined impedance value;
   amplifier means having a plurality of selectable gain factors coupled to said reference means for providing a plurality of synthesized impedance values wherein said amplifier means is configurable in one of a series mode and a shunt mode; and
   means for configuring said amplifier means and coupling said plurality of synthesized impedance values to a device to be calibrated in accordance with said series mode and said shunt mode.

2. An impedance synthesizer in accordance with claim 1 wherein said amplifier means comprises an operational amplifier having a gain factor controlled by a multiplying digital-to-analog converter.

3. An impedance synthesizer in accordance with claim 2 wherein said multiplying digital-to-analog converter is programmable.

4. An impedance synthesizer in accordance with claim 1 wherein said reference means comprises one of a resistor element, a capacitor element, and an inductor element.

5. An impedance synthesizer, comprising:
   a pair of reference terminals;
   a reference element having a predetermined impedance value coupled to at least one of said pair of reference terminals;
   an amplifier being configurable in one of a series mode and a shunt mode with said reference element to provide a plurality of selectable synthesized impedance values in accordance with a plurality of selectable gain factors and said predetermined impedance value;
   wherein a selected one of said synthesized impedance values is provided across said pair of reference terminals by coupling said amplifier to said pair of reference terminals in accordance with said series mode and said shunt mode.

6. An impedance synthesizer in accordance with claim 5 further comprising said amplifier configured in said series mode wherein said reference element is coupled to an input and an output of said amplifier, and at least one of said pair of reference terminals is coupled to ground.

7. An impedance synthesizer in accordance with claim 5 wherein said amplifier is configured in said shunt mode wherein said reference element is coupled to an input of said amplifier and to ground and an output of said amplifier is coupled to at least one of said pair of reference terminals.

8. An impedance synthesizer in accordance with claim 5 wherein said amplifier comprises an operational amplifier having voltage gain controlled by a multiplying digital-to-analog converter.

9. An impedance synthesizer in accordance with claim 5 wherein said multiplying digital-to-analog converter is programmable.

10. A programmable impedance synthesizer, comprising:
    a pair of reference terminals;
    a reference element having a predetermined impedance value coupled to at least one of said pair of reference terminals;
    an amplifier comprising a programmable multiplying digital to analog converter, wherein said amplifier is configurable in one of a series mode and shunt mode with said reference element to provide a plurality of selectable synthesized impedances in accordance with a plurality of selectable gain factors and said predetermined impedance values wherein said gain factors are controlled by a programmable multiplying digital-to-analog converter;
    wherein a selected one of said synthesized impedance values is provided across said pair of reference terminals by coupling said amplifier to said pair of reference terminals in accordance with said series mode and said shunt mode.

* * * * *